United States Patent
Xu et al.

(10) Patent No.: US 10,580,731 B2
(45) Date of Patent: Mar. 3, 2020

(54) COMBINED ELECTRODE AND THREE-LEVEL HIGH-POWER MODULE THEREOF

(71) Applicant: YANGZHOU GUOYANG ELECTRONIC CO., LTD., Jiangsu (CN)

(72) Inventors: Wenhui Xu, Jiangsu (CN); Yulin Wang, Jiangsu (CN); Hesong Teng, Jiangsu (CN)

(73) Assignee: YANGZHOU GUOYANG ELECTRONIC CO., LTD., Jiangsu (CN)

( * ) Notice: Subject to any disclaimer, the term of this patent is extended or adjusted under 35 U.S.C. 154(b) by 0 days.

(21) Appl. No.: 16/098,876

(22) PCT Filed: May 9, 2016

(86) PCT No.: PCT/CN2016/081385
§ 371 (c)(1),
(2) Date: Nov. 5, 2018

(87) PCT Pub. No.: WO2017/190368
PCT Pub. Date: Nov. 9, 2017

(65) Prior Publication Data
US 2019/0139884 A1    May 9, 2019

(30) Foreign Application Priority Data
May 3, 2016    (CN) .......................... 2016 1 0284695

(51) Int. Cl.
*H01L 23/50* (2006.01)
*H01L 25/18* (2006.01)
(Continued)

(52) U.S. Cl.
CPC .............. *H01L 23/50* (2013.01); *H01L 23/48* (2013.01); *H01L 25/072* (2013.01); *H01L 25/18* (2013.01); *H02M 7/003* (2013.01); *H02M 7/487* (2013.01)

(58) Field of Classification Search
CPC ..................................................... H01L 23/48
See application file for complete search history.

(56) References Cited

U.S. PATENT DOCUMENTS 5,408,128 A  *  4/1995  Furnival  ........... H01L 23/49811
257/690
2006/0267135 A1*  11/2006  Wolfgang  ........... H01L 23/5389
257/528

(Continued)

FOREIGN PATENT DOCUMENTS

CN          101741227        6/2010
CN          102882385        1/2013
(Continued)

OTHER PUBLICATIONS

Peng, "Layout of Laminated Bus Bar for Diode Neutral Point Clamped Three-level Inverter", High Power Converter Technology, Apr. 2014, pp. 14-17 and 22.

(Continued)

*Primary Examiner* — Thao P Le
(74) *Attorney, Agent, or Firm* — JCIPRNET

(57) ABSTRACT

A combined electrode comprises a negative electrode, a first intermediate electrode, a positive electrode and a second intermediate electrode, wherein a main body portion of the negative electrode and a main body portion of the first intermediate electrode, a connection portion of the negative electrode and a connection portion of the first intermediate electrode, main body portions of the positive electrode and main body portions of the second intermediate electrode, and a connection portion of the positive electrode and a
(Continued)

connection portion of the second intermediate electrode are arranged in parallel to and directly facing each other, thereby increasing a facing area between the negative electrode and the first intermediate electrode and between the positive electrode and the second intermediate electrode, reducing a current loop area between the negative electrode and the first intermediate electrode and between the positive electrode and the second intermediate electrode.

20 Claims, 5 Drawing Sheets

(51) Int. Cl.
  *H01L 23/48* (2006.01)
  *H01L 25/07* (2006.01)
  *H02M 7/00* (2006.01)
  *H02M 7/487* (2007.01)

(56) References Cited

U.S. PATENT DOCUMENTS

| 2011/0308834 A1 | 12/2011 | Takahashi | |
|---|---|---|---|
| 2012/0248564 A1* | 10/2012 | Hauenstein | H01L 23/34 257/467 |
| 2013/0146991 A1* | 6/2013 | Otremba | H01L 25/071 257/401 |

FOREIGN PATENT DOCUMENTS

| CN | 103514982 | 1/2014 |
| CN | 103872935 | 6/2014 |
| CN | 205723513 | 11/2016 |
| JP | 2005347561 | 12/2005 |

OTHER PUBLICATIONS

"International Search Report (Form PCT/ISA/210)", dated Dec. 30, 2016, with English translation thereof, pp. 1-6.

\* cited by examiner

COMBINED ELECTRODE AND THREE-LEVEL HIGH-POWER MODULE THEREOF

CROSS-REFERENCE TO RELATED APPLICATION

This application is a 371 application of an international PCT application serial no. PCT/CN2016/081385, filed on May 9, 2016, which claims priority to and the benefit of China Patent Application No. CN201610284695.X, filed on May 3, 2016. The entirety of each of the above-mentioned patent applications is hereby incorporated by reference herein and made a part of this specification.

TECHNICAL FIELD

The present invention relates to the field of power electronics, and more particularly, to a combined electrode and a three-level high-power module thereof.

BACKGROUND

A power module is a power switch module in which power electronic devices such as a metal oxide semiconductor (power MOS transistor), an insulated gate bipolar transistor (IGBT), and a fast recovery diode (FRD) are packaged according to a certain functional combination, and is mainly used for power conversion in various occasions such as electric vehicle, photovoltaic power generation, wind power generation, and industrial frequency conversion.

In the prior art, a main body portion of a positive electrode of a power module and a main body portion of an intermediate electrode, or a main body portion of a negative electrode and the main body portion of the intermediate electrode are alternatively arranged in parallel generally. A connection portion of the positive electrode is not arranged in parallel to and directly facing a connection portion of the intermediate electrode, or a connection portion of the negative electrode is not arranged in parallel to and directly facing the connection portion of the intermediate electrode either. A facing area between the positive electrode and the intermediate electrode, or between the negative electrode and the intermediate electrode is small, thereby resulting in a large current loop area between the positive electrode and the intermediate electrode, or between the negative electrode and the intermediate electrode, so that the stray inductance and the loss of the power module are large.

SUMMARY

Object of Invention the present invention is intended to provide a combined electrode with small current loop area, and a three-level high-power module using the combined electrode with small stray inductance and loss.

Technical Solution in order to achieve the object, the present invention uses the following technical solutions:

A combined electrode according to the present invention includes a negative electrode, a first intermediate electrode, a positive electrode and a second intermediate electrode, the negative electrode includes a main body portion of the negative electrode and a connection portion of the negative electrode, the first intermediate electrode includes a main body portion of the first intermediate electrode and a connection portion of the first intermediate electrode in parallel to and directly facing the connection portion of the negative electrode, the positive electrode includes a main body portion of the positive electrode and a connection portion of the positive electrode, and the second intermediate electrode includes a main body portion of the second intermediate electrode and a connection portion of the second intermediate electrode in parallel to and directly facing the connection portion of the positive electrode. The main body portion of the negative electrode angularly extends out from a side end of the connection portion of the negative electrode, and a leading portion of the negative electrode bends out of a top portion of the connection portion of the negative electrode; the main body portion of the first intermediate electrode in parallel to and directly facing the main body portion of the negative electrode angularly extends out from a side end of the connection portion of the first intermediate electrode, and a leading portion of the first intermediate electrode bends out of a top portion of the connection portion of the first intermediate electrode; the main body portion of the positive electrode angularly extends out from a side end of the connection portion of the positive electrode, and a leading portion of the positive electrode bends out of a top portion of the connection portion of the positive electrode; the main body portion of the second intermediate electrode in parallel to and directly facing the main body portion of the positive electrode angularly extends out from a side end of the connection portion of the second intermediate electrode, and a leading portion of the second intermediate electrode bends out of a top portion of the connection portion of the second intermediate electrode. An insulating layer is arranged between the main body portion of the negative electrode and the main body portion of the first intermediate electrode, between the connection portion of the negative electrode and the connection portion of the first intermediate electrode, between the main body portion of the positive electrode and the main body portion of the second intermediate electrode, and between the connection portion of the positive electrode and the connection portion of the second intermediate electrode.

In order to further reduce the stray inductance of the combined electrode, the leading portion of the negative electrode and the leading portion of the first intermediate electrode are arranged back to back, and the leading portion of the positive electrode and the leading portion of the second intermediate electrode are arranged back to back.

Further, a bending direction of the leading portion of the negative electrode is consistent with an extending direction of the main body portion of the negative electrode.

Further, the main body portion of the positive electrode includes a first main body portion of the positive electrode and a second main body portion of the positive electrode extending to opposite directions from two side ends of the connection portion of the positive electrode, and a bending direction of the leading portion of the positive electrode is consistent with an extending direction of the first main body portion of the positive electrode.

Further, the main body portion of the second intermediate electrode includes a first main body portion of the second intermediate electrode and a second main body portion of the second intermediate electrode extending to opposite directions from two side ends of the connection portion of the second intermediate electrode, and a bending direction of the leading portion of the second intermediate electrode is consistent with an extending direction of the first main body portion of the second intermediate electrode.

Further, the first main body portion of the second intermediate electrode is connected to the side end of the connection portion of the first intermediate electrode.

A three-level high-power module according to the present invention uses any one of the combined electrodes above.

Further, the three-level high-power module further includes an insulating substrate, the insulating substrate includes a lower half-bridge insulating substrate and an upper half-bridge insulating substrate, the lower half-bridge insulating substrate is provided with a connection point of the negative electrode and a connection point of the first intermediate electrode, the main body portion of the negative electrode is connected to the connection point of the negative electrode, the main body portion of the first intermediate electrode is connected to the connection point of the first intermediate electrode, the upper half-bridge insulating substrate is provided with a connection point of the positive electrode and a connection point of the second intermediate electrode, the main body portion of the positive electrode is connected to the connection point of the positive electrode, and the main body portion of the second intermediate electrode is connected to the connection point of the second intermediate electrode.

Further, all the connection point of the negative electrode, the connection point of the first intermediate electrode, the connection point of the positive electrode and the connection point of the second intermediate electrode are arranged in a matrix.

In order to prevent dangerous conditions such as electrode arc discharge and power module burning caused by any two electrodes conducted when a chip on the insulating substrate explodes, an insulating septum is arranged between any one or more electrodes of the negative electrode, the first intermediate electrode, the positive electrode and the second intermediate electrode, and the insulating substrate, so as to effectively separate conductive gas generated by explosion from the electrode, thereby increasing the use security of the power module.

Further, the main body portion of the negative electrode is connected to a big arm of the negative electrode located above the lower half-bridge insulating substrate, a small arm of the negative electrode is led out from at least one of a left side and a right side of the big arm of the negative electrode, and the small arm of the negative electrode is connected to the connection point of the negative electrode. In this way, the resistance and stray inductance of a loop formed by the negative electrode and the first intermediate electrode can be balanced through adjusting a width of the big arm of the negative electrode, thereby increasing a dynamic and static current-sharing performance of the power module.

In order to separate the conductive gas generated by explosion of the chip on the insulating substrate from the big arm of the negative electrode, and increase the use security of the power module, an insulating septum is arranged between the big arm of the negative electrode and the insulating substrate, and the insulating septum is provided with a hole for the small arm of the negative electrode to pass through.

Further, the small arm of the negative electrode includes a first portion of the small arm of the negative electrode led by a coplane of the big arm of the negative electrode and a second portion of the small arm of the negative electrode led by the bending of the first portion of the small arm of the negative electrode, the second portion of the small arm of the negative electrode is connected to the connection point of the negative electrode, and in order to further separate the conductive gas generated by explosion of the chip on the insulating substrate from the small arm of the negative electrode, and increase the use security of the power module, a frame surrounding the second portion of the small arm of the negative electrode extends out from the hole in the insulating septum towards a direction of the insulating substrate.

Further, the main body portion of the first intermediate electrode is connected to a big arm of the first intermediate electrode located above the lower half-bridge insulating substrate, a small arm of the first intermediate electrode is led out from at least one of a left side and a right side of the big arm of the first intermediate electrode, and the small arm of the first intermediate electrode is connected to the connection point of the first intermediate electrode. In this way, the resistance and stray inductance of the loop formed by the negative electrode and the first intermediate electrode can be balanced through adjusting a width of the big arm of the first intermediate electrode, thereby increasing the dynamic and static current-sharing performance of the power module.

In order to separate the conductive gas generated by explosion of the chip on the insulating substrate from the big arm of the first intermediate electrode, and increase the use security of the power module, an insulating septum is arranged between the big arm of the first intermediate electrode and the insulating substrate, and the insulating septum is provided with a hole for the small arm of the first intermediate electrode to pass through.

Further, the small arm of the first intermediate electrode includes a first portion of the small arm of the first intermediate electrode led by a coplane of the big arm of the first intermediate electrode and a second portion of the small arm of the first intermediate electrode led by the bending of the first portion of the small arm of the first intermediate electrode, the second portion of the small arm of the first intermediate electrode is connected to the connection point of the first intermediate electrode, and in order to further separate the conductive gas generated by explosion of the chip on the insulating substrate from the small arm of the first intermediate electrode, and increase the use security of the power module, a frame surrounding the second portion of the small arm of the first intermediate electrode extends out from the hole in the insulating septum towards a direction of the insulating substrate.

Further, the main body portion of the negative electrode is connected to the big arm of the negative electrode located above the lower half-bridge insulating substrate, a small arm of the negative electrode is led out from at least one of a left side and a right side of the big arm of the negative electrode, and the small arm of the negative electrode is connected to the connection point of the negative electrode; the main body portion of the first intermediate electrode is connected to a big arm of the first intermediate electrode located above the lower half-bridge insulating substrate, a small arm of the first intermediate electrode is led out from at least one of a left side and a right side of the big arm of the first intermediate electrode, and the small arm of the first intermediate electrode is connected to the connection point of the first intermediate electrode; and the big arm of the negative electrode is arranged in parallel to and directly facing the big arm of the first intermediate electrode, and an insulating layer is arranged between the big arm of the negative electrode and the big arm of the first intermediate electrode. In this way, the facing area between the big arm of the negative electrode and the big arm of the first intermediate electrode is effectively increased, the current loop area between the negative electrode and the first intermediate electrode is reduced, and the stray inductance and the loss of the power module are reduced.

Further, the main body portion of the positive electrode is connected to a big arm of the positive electrode located above the upper half-bridge insulating substrate, a small arm of the positive electrode is led out from at least one of a left side and a right side of the big arm of the positive electrode, and the small arm of the positive electrode is connected to the connection point of the positive electrode. In this way, the resistance and stray inductance of a loop formed by the positive electrode and the second intermediate electrode can be balanced through adjusting a width of the big arm of the positive electrode, thereby increasing the dynamic and static current-sharing performance of the power module.

In order to separate the conductive gas generated by explosion of the chip on the insulating substrate from the big arm of the positive electrode, and increase the use security of the power module, an insulating septum is arranged between the big arm of the positive electrode and the insulating substrate, and the insulating septum is provided with a hole for the small arm of the positive electrode to pass through.

Further, the small atm of the positive electrode includes a first portion of the small arm of the positive electrode led by a coplane of the big arm of the positive electrode and a second portion of the small arm of the positive electrode led by the bending of the first portion of the small arm of the positive electrode, the second portion of the small arm of the positive electrode is connected to the connection point of the positive electrode, and in order to further separate the conductive gas generated by explosion of the chip on the insulating substrate from the small arm of the positive electrode, and increase the use security of the power module, a frame surrounding the second portion of the small arm of the positive electrode extends out from the hole in the insulating septum towards a direction of the insulating substrate.

Further, the main body portion of the second intermediate electrode is connected to a big arm of the second intermediate electrode located above the upper half-bridge insulating substrate, a small arm of the second intermediate electrode is led out from at least one of a left side and a right side of the big arm of the second intermediate electrode, and the small arm of the second intermediate electrode is connected to the connection point of the second intermediate electrode. In this way, the resistance and stray inductance of the loop formed by the positive electrode and the second intermediate electrode can be balanced through adjusting a width of the big arm of the second intermediate electrode, thereby increasing the dynamic and static current-sharing performance of the power module.

In order to separate the conductive gas generated by explosion of the chip on the insulating substrate from the big arm of the second intermediate electrode, and increase the use security of the power module, an insulating septum is arranged between the big arm of the second intermediate electrode and the insulating substrate, and the insulating septum is provided with a hole for the small arm of the second intermediate electrode to pass through.

Further, the small arm of the second intermediate electrode includes a first portion of the small arm of the second intermediate electrode led by a coplane of the big arm of the second intermediate electrode and a second portion of the small arm of the second intermediate electrode led by the bending of the first portion of the small arm of the second intermediate electrode, the second portion of the small arm of the second intermediate electrode is connected to the connection point of the second intermediate electrode, and in order to further separate the conductive gas generated by explosion of the chip on the insulating substrate from the small arm of the second intermediate electrode, and increase the use security of the power module, a frame surrounding the second portion of the small atm of the second intermediate electrode extends out from the hole in the insulating septum towards a direction of the insulating substrate.

Further, the main body portion of the positive electrode is connected to the big atm of the positive electrode located above the upper half-bridge insulating substrate, a small arm of the positive electrode is led out from at least one of a left side and a right side of the big atm of the positive electrode, and the small arm of the positive electrode is connected to the connection point of the positive electrode; the main body portion of the second intermediate electrode is connected to a big arm of the second intermediate electrode located above the upper half-bridge insulating substrate, a small arm of the second intermediate electrode is led out from at least one of a left side and a right side of the big arm of the second intermediate electrode, and the small arm of the second intermediate electrode is connected to the connection point of the second intermediate electrode; and the big arm of the positive electrode is arranged in parallel to and directly facing the big arm of the second intermediate electrode, and an insulating layer is arranged between the big arm of the positive electrode and the big arm of the second intermediate electrode. In this way, the facing area between the big arm of the positive electrode and the big arm of the second intermediate electrode is effectively increased, the current loop area between the positive electrode and the second intermediate electrode is reduced, and the stray inductance and the loss of the power module are reduced.

Beneficial Effects:

(1) The present invention discloses the combined electrode, the main body portion of the negative electrode is arranged in parallel to and directly facing the main body portion of the first intermediate electrode, and the connection portion of the negative electrode is arranged in parallel to and directly facing the connection portion of the first intermediate electrode too, and the main body portion of the positive electrode is arranged in parallel to and directly facing the main body portion of the second intermediate electrode, and the connection portion of the positive electrode is arranged in parallel to and directly facing the connection portion of the second intermediate electrode, thereby increasing the facing area between the negative electrode and the first intermediate electrode and between the positive electrode and the second intermediate electrode, reducing the current loop area between the negative electrode and the first intermediate electrode and between the positive electrode and the second intermediate electrode, and effectively reducing the stray inductance and loss of the combined electrode.

(2) The present invention further discloses the three-level high-power module using the combined electrode, thereby effectively reducing the stray inductance and the loss of the power module.

DETAILED DESCRIPTION

The technical solutions of the present invention are further described with reference to the drawings and in the combination of the embodiments hereunder.

The present invention discloses a combined electrode, and taking the two following embodiments as examples, a structure of the combined electrode is introduced.

First Embodiment

Figure 1:
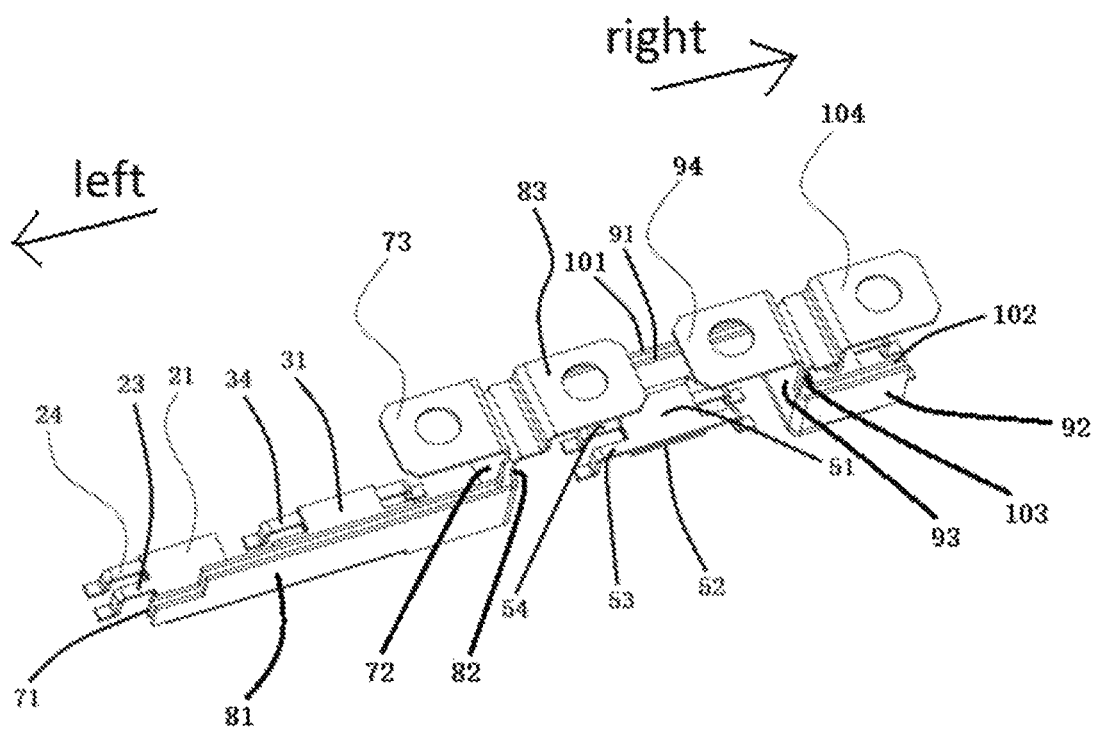
FIG. 1 is a stereoscopic diagram of a combined electrode in the first embodiment of the present invention.
Figure 2:
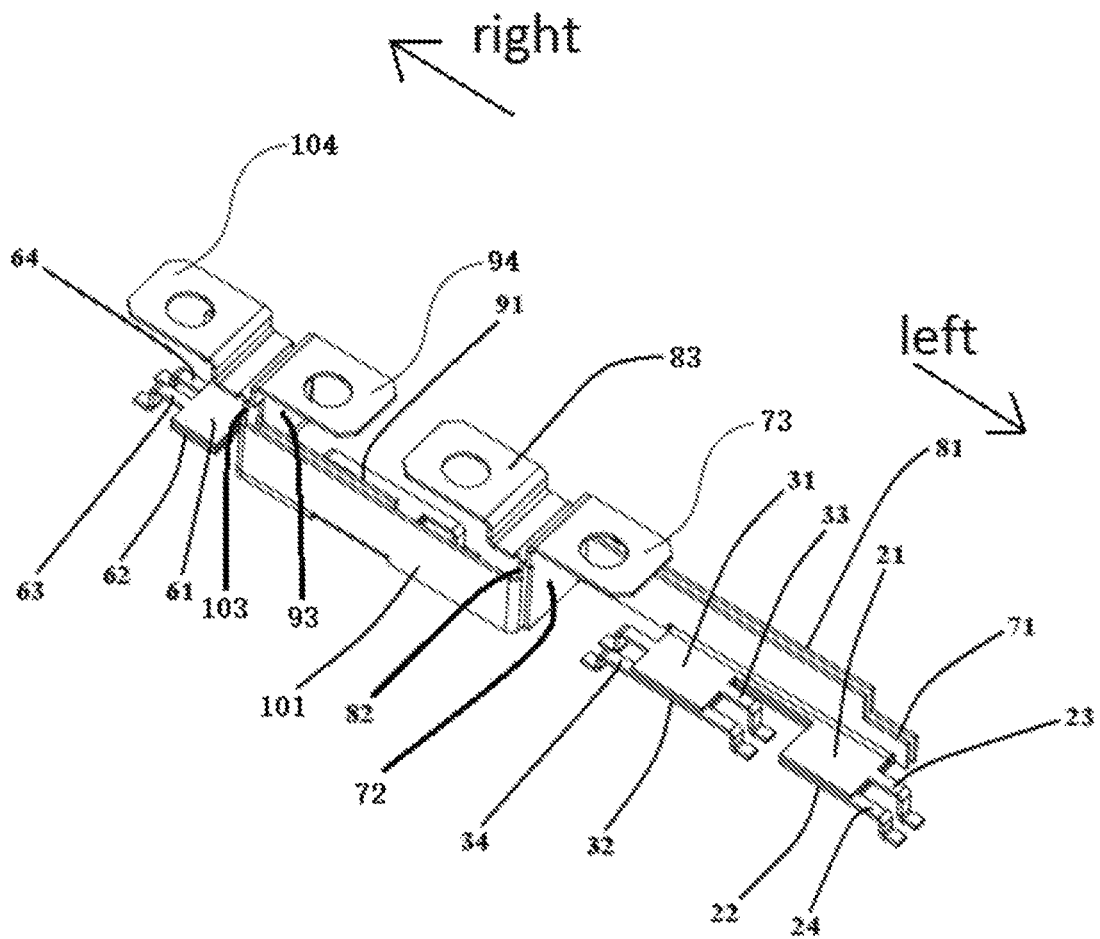
FIG. 2 is a rear view of FIG. 1.

As shown in FIG. 1 and FIG. 2, the combined electrode includes a negative electrode, a first intermediate electrode, a positive electrode and a second intermediate electrode. The negative electrode includes a connection portion 72 of the negative electrode, a main body portion 71 of the negative electrode extends out from a side end of the connection portion 72 of the negative electrode towards the left by 90°, and a leading portion 73 of the negative electrode bends out of a top portion of the connection portion 72 of the negative electrode towards the left. The first intermediate electrode includes a connection portion 82 of the first intermediate electrode, a main body portion 81 of the first intermediate electrode extends out from a side end of the connection portion 82 of the first intermediate electrode towards the left by 90°, and a leading portion 83 of the first intermediate electrode bends out of a top portion of the connection portion 82 of the first intermediate electrode towards the right. The positive electrode includes a connection portion 93 of the positive electrode, a first main body portion 91 of the positive electrode extends out from a side end of the connection portion 93 of the positive electrode towards the left by 90°, a second main body portion 92 of the positive electrode extends out from the other side end of the connection portion 93 of the positive electrode towards the right by 90°, and a leading portion 94 of the positive electrode bends out of a top portion of the connection portion 93 of the positive electrode towards the left. The second intermedia electrode includes a connection portion 103 of the second intermedia electrode, a first main body portion 101 of the second intermedia electrode extends out from a side end of the connection portion 103 of the second intermedia electrode towards the left by 90°, a second main body portion 102 of the second intermedia electrode extends out from the other side end of the connection portion 103 of the second intermedia electrode towards the right by 90°, and a leading portion 104 of the second intermedia electrode bends out of a top portion of the connection portion 103 of the second intermedia electrode towards the right. The first main body portion 101 of the second intermedia electrode is connected to the other side end of the connection portion 82 of the first intermediate electrode. A space between the connection portion 72 of the negative electrode and the connection portion 82 of the first intermediate electrode, a space between the main body portion 71 of the negative electrode and the main body portion 81 of the first intermediate electrode, a space between the connection portion 93 of the positive electrode and the connection portion 103 of the second intermedia electrode, a space between the first main body portion 91 of the positive electrode and the first main body portion 101 of the second intermedia electrode, and a space between the second main body portion 92 of the positive electrode and the second main body portion 102 of the second intermedia electrode are all 0.1 to 2 mm.

Thus it can be seen that the connection portion 72 of the negative electrode is arranged in parallel to and directly facing the connection portion 82 of the first intermediate electrode, the main body portion 71 of the negative electrode is arranged in parallel to and directly facing the main body portion 81 of the first intermediate electrode, the connection portion 93 of the positive electrode is arranged in parallel to and directly facing the connection portion 103 of the second intermedia electrode, the first main body portion 91 of the positive electrode is arranged in parallel to and directly facing the first main body portion 101 of the second intermedia electrode, and the second main body portion 92 of the positive electrode is also arranged in parallel to and directly facing the second main body portion 102 of the second intermedia electrode, and the leading portion 73 of the negative electrode is arranged on contrary to the leading portion 83 of the first intermediate electrode, and the leading portion 94 of the positive electrode is arranged on contrary to the leading portion 104 of the second intermedia electrode. The resulting benefit is that a facing area between the negative electrode and the first intermediate electrode, and between the positive electrode and the second intermediate electrode is large, so that a current loop area between the negative electrode and the first intermediate electrode, and between the positive electrode and the second intermediate electrode is small, thereby reducing the stray inductance and the loss of the combined electrode.

In addition, an included angle between the connection portion 72 of the negative electrode and the main body portion 71 of the negative electrode, an included angle between the connection portion 82 of the first intermediate electrode and the main body portion 81 of the first intermediate electrode, an included angle between the connection portion 93 of the positive electrode and the first main body portion 91 of the positive electrode, an included angle between the connection portion 93 of the positive electrode and the second main body portion 92 of the positive electrode, an included angle between the connection portion 103 of the second intermediate electrode and the first main body portion 101 of the second intermediate electrode, and an included angle between the connection portion 103 of the second intermediate electrode and the second main body portion 102 of the second intermediate electrode can all be any value in an open interval of (0°, 180°).

Second Embodiment

As shown in FIG. 1 and FIG. 2, the combined electrode includes a negative electrode, a first intermediate electrode, a positive electrode and a second intermediate electrode. The negative electrode includes a connection portion 72 of the negative electrode, a main body portion 71 of the negative electrode extends out from a side end of the connection portion 72 of the negative electrode towards the left by 90°, and a leading portion 73 of the negative electrode bends out of a top portion of the connection portion 72 of the negative electrode towards the left. The first intermediate electrode includes a connection portion 82 of the first intermediate electrode, a main body portion 81 of the first intermediate electrode extends out from a side end of the connection portion 82 of the first intermediate electrode towards the left by 90°, and a leading portion 83 of the first intermediate electrode bends out of a top portion of the connection portion 82 of the first intermediate electrode towards the right. The positive electrode includes a connection portion 93 of the positive electrode, a first main body portion 91 of the positive electrode extends out from a side end of the connection portion 93 of the positive electrode towards the left by 90°, a second main body portion 92 of the positive electrode extends out from the other side end of the connection portion 93 of the positive electrode towards the right by 90°, and a leading portion 94 of the positive electrode bends out of a top portion of the connection portion 93 of the positive electrode towards the left. The second intermedia electrode includes a connection portion 103 of the second intermedia electrode, a first main body portion 101 of the second intermedia electrode extends out from a side end of the connection portion 103 of the second intermedia electrode towards the left by 90°, a second main body portion 102 of the second intermedia electrode extends out from the other side end of the connection portion 103 of the second intermedia electrode towards the right by 90°, and a leading portion 104 of the second intermedia electrode bends out of a top portion of the connection portion 103 of the second intermedia electrode towards the right. The first main body portion 101 of the second intermedia electrode is separate from the connection portion 82 of the first intermediate electrode (not shown in FIG. 1 and FIG. 2). A space between the connection portion 72 of the negative electrode and the connection portion 82 of the first intermediate electrode, a space between the main body portion 71 of the negative electrode and the main body portion 81 of the first intermediate electrode, a space between the connection portion 93 of the positive electrode and the connection portion 103 of the second intermedia electrode, a space between the first main body portion 91 of the positive electrode and the first main body portion 101 of the second intermedia electrode, and a space between the second main body portion 92 of the positive electrode and the second main body portion 102 of the second intermedia electrode are all 0.1 to 2 mm.

Thus it can be seen that the connection portion 72 of the negative electrode is arranged in parallel to and directly facing the connection portion 82 of the first intermediate electrode, the main body portion 71 of the negative electrode is arranged in parallel to and directly facing the main body portion 81 of the first intermediate electrode, the connection portion 93 of the positive electrode is arranged in parallel to and directly facing the connection portion 103 of the second intermedia electrode, the first main body portion 91 of the positive electrode is arranged in parallel to and directly facing the first main body portion 101 of the second intermedia electrode, and the second main body portion 92 of the positive electrode is also arranged in parallel to and directly facing the second main body portion 102 of the second intermedia electrode, and the leading portion 73 of the negative electrode is arranged on contrary to the leading portion 83 of the first intermediate electrode, and the leading portion 94 of the positive electrode is arranged on contrary to the leading portion 104 of the second intermedia electrode. The resulting benefit is that a facing area between the negative electrode and the first intermediate electrode, and between the positive electrode and the second intermediate electrode is large, so that a current loop area between the negative electrode and the first intermediate electrode, and between the positive electrode and the second intermediate electrode is small, thereby reducing the stray inductance and the loss of the combined electrode.

In addition, an included angle between the connection portion 72 of the negative electrode and the main body portion 71 of the negative electrode, an included angle between the connection portion 82 of the first intermediate electrode and the main body portion 81 of the first intermediate electrode, an included angle between the connection portion 93 of the positive electrode and the first main body portion 91 of the positive electrode, an included angle between the connection portion 93 of the positive electrode and the second main body portion 92 of the positive electrode, an included angle between the connection portion 103 of the second intermedia electrode and the first main body portion 101 of the second intermedia electrode, and an included angle between the connection portion 103 of the second intermedia electrode and the second main body portion 102 of the second intermedia electrode can all be any value in an open interval of (0°, 180°).

The present invention discloses a three-level high-power module, and taking the two following embodiments as examples, a structure of the power module is introduced.

Third Embodiment

Figure 3:
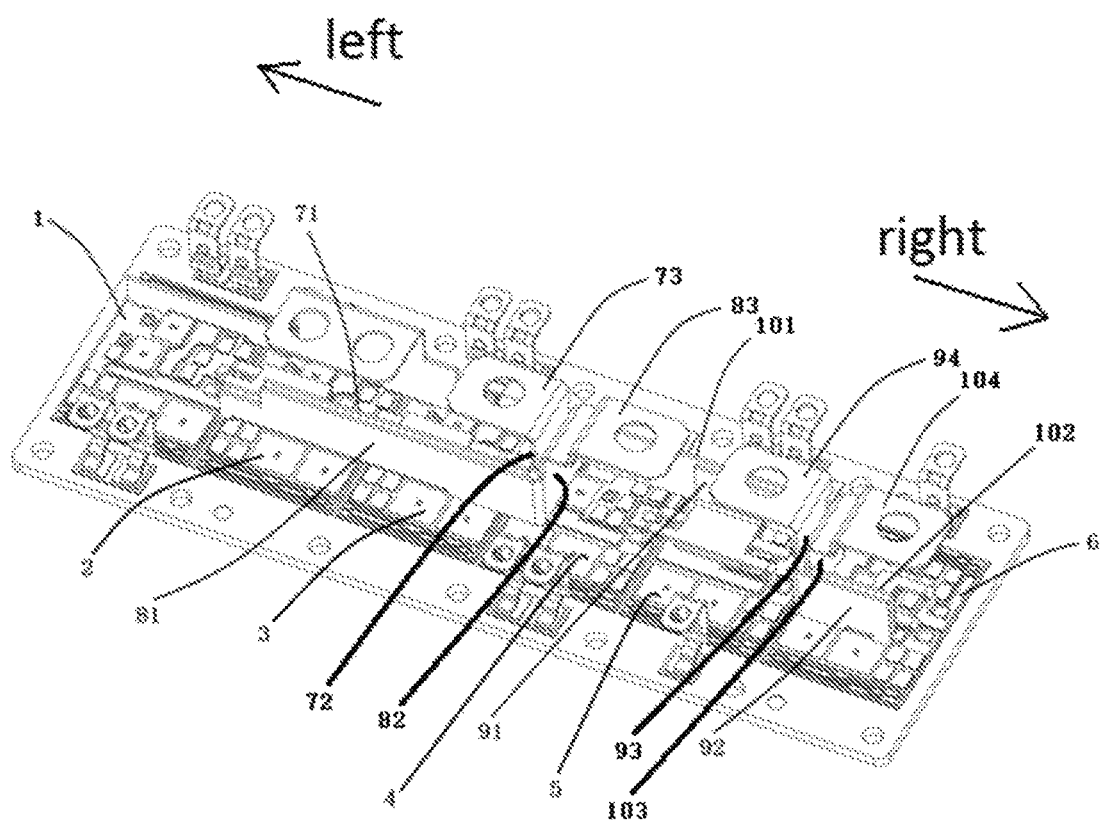
FIG. 3 is a stereoscopic diagram of a power module in the third embodiment of the present invention.

As shown in FIG. 3, a power module includes sixth insulating substrates arranged in a row, three substrates at left are lower half-bridge insulating substrates, and are respectively a first lower half-bridge insulating substrate 1, a second lower half-bridge insulating substrate 2 and a third lower half-bridge insulating substrate 3, and three substrates at right are upper half-bridge insulating substrates, and are respectively a first upper half-bridge insulating substrate 4, a second upper half-bridge insulating substrate 5 and a third upper half-bridge insulating substrate 6.

Figure 4:
FIG. 4 is a top view of the power module without the combined electrode in the third embodiment of the present invention.

As shown in FIG. 4, a connection point 15 of a first negative electrode arranged in a column with a connection point 16 of a first lower half-bridge intermediate electrode, a connection point 25 of a second negative electrode arranged in a column with a connection point 26 of a second lower half-bridge intermediate electrode, a connection point 35 of a third negative electrode arranged in a column with a connection point 36 of a third lower half-bridge intermediate electrode, a connection point 45 of a first positive electrode arranged in a column with a connection point 46 of a first upper half-bridge intermediate electrode, a connection point 55 of a second positive electrode arranged in a column with a connection point 56 of a second upper half-bridge intermediate electrode, and a connection point 65 of a third positive electrode arranged in a column with a connection point 66 of a third upper half-bridge intermediate electrode are respectively arranged in right-half areas of the first lower half-bridge insulating substrate 1, the second lower half-bridge insulating substrate 2, the third lower half-bridge insulating substrate 3, the first upper half-bridge insulating substrate 4, the second upper half-bridge insulating substrate 5 and the third upper half-bridge insulating substrate 6. The connection point 15 of the first negative electrode, the connection point 25 of the second negative electrode, and the connection point 35 of the third negative electrode are collectively called the connection point of the negative electrode, the connection point 16 of the first lower half-bridge intermediate electrode, the connection point 26 of the second lower half-bridge intermediate electrode, and the connection point 36 of the third lower half-bridge intermediate electrode are collectively called the connection point of the first intermediate electrode, the connection point 45 of the first positive electrode, the connection point 55 of the second positive electrode, and the connection point 65 of the third positive electrode are collectively called the connection point of the positive electrode, and the connection point 46 of the first upper half-bridge intermediate electrode, the connection point 56 of the second upper half-bridge intermediate electrode, and the connection point 66 of the third upper half-bridge intermediate electrode are collectively called the connection point of the second intermediate electrode. All the connection point of the negative electrode, the connection point of the first intermediate electrode, the connection point of the positive electrode and the connection point of the second intermediate electrode are arranged in a matrix.

The power module uses the combined electrode described in the first embodiment, as shown in FIG. 3. A connection portion 72 of the negative electrode and a connection portion 82 of the first intermediate electrode are both arranged on the first upper half-bridge insulating substrate 4, a main body portion 71 of the negative electrode and a main body portion 81 of the first intermediate electrode both extend out from the first upper half-bridge insulating substrate 4 to the second lower half-bridge insulating substrate 2. A connection portion 93 of the positive electrode and a connection portion 103 of the second intermediate electrode are both arranged on the third upper half-bridge insulating substrate 6, a first main body portion 91 of the positive electrode extends out from the third upper half-bridge insulating substrate 6 to the second upper half-bridge insulating substrate 5, a second main body portion 92 of the positive electrode is arranged on the third upper half-bridge insulating substrate 6, a first main body portion 101 of the second intermediate electrode extends out from the third upper half-bridge insulating substrate 6 to the first upper half-bridge insulating substrate 4, and is connected to the other side end of the connection portion 82 of the first intermediate electrode, and a second main body portion 102 of the second intermediate electrode is arranged on the third upper half-bridge insulating substrate 6.

As shown in FIG. 1 and FIG. 3, a first big arm 21 located above the second lower half-bridge insulating substrate 2 vertically extends out from a side surface of the main body portion 71 of the negative electrode, a first small arm 23 extends out from a left side of the first big arm 21, and the first small arm 23 is connected to the connection point 15 of the first negative electrode; as shown in FIG. 2 and FIG. 3, a second big arm 22 located above the second lower half-bridge insulating substrate 2 vertically extends out from a side surface of the main body portion 81 of the first intermediate electrode, a second small arm 24 extends out from a left side of the second big arm 22, and the second small arm 24 is connected to the connection point 16 of the first lower half-bridge intermediate electrode; and as shown in FIG. 2 and FIG. 3, the first big arm 21 is arranged in parallel to and directly facing the second big arm 22 above the second lower half-bridge insulating substrate 2, and the first big arm 21 is located above the second big arm 22. As shown in FIG. 2 and FIG. 3, a third big arm 31 located above the third lower half-bridge insulating substrate 3 also vertically extends out from the side surface of the main body portion 71 of the negative electrode, third small arms 33 extend out from both lift and right sides of the third big arm 31, the third small arm 33 at left is connected to the connection point 25 of the second negative electrode, and the third small arm 33 at right is connected to the connection point 35 of the third negative electrode; as shown in FIG. 2 and FIG. 3, a fourth big arm 32 located above the third lower half-bridge insulating substrate 3 also vertically extends out from the side surface of the main body portion 81 of the first intermediate electrode, fourth small arms 34 extend out from both lift and right sides of the fourth big arm 32, the fourth small arm 34 at left is connected to the connection point 26 of the second lower half-bridge intermediate electrode, and the fourth small arm 34 at right is connected to the connection point 36 of the third lower half-bridge intermediate electrode; and as shown in FIG. 2 and FIG. 3, the third big arm 31 is arranged parallel to and directly facing the fourth big arm 32 above the third lower half-bridge insulating substrate 3, and the third big arm 31 is located above the fourth big arm 32. As shown in FIG. 1 and FIG. 3, a fifth big arm 51 located above the second upper half-bridge insulating substrate 5 vertically extends out from a side surface of the main body portion 91 of the positive electrode, fifth small arms 53 extend out from both lift and right sides of the fifth big arm 51, the fifth small arm 53 at left is connected to the connection point 45 of the first positive electrode, and the fifth small arm 53 at right is connected to the connection point 55 of the second positive electrode; as shown in FIG. 1 and FIG. 3, a sixth big arm 52 located above the second upper half-bridge insulating substrate 5 vertically extends out from a side surface of the first main body portion 101 of the second intermediate electrode, sixth small arms 54 extend out from both lift and right sides of the sixth big arm 52, the sixth small arm 54 at left is connected to the connection point 46 of the first upper half-bridge intermediate electrode, and the sixth small arm 54 at right is connected to the connection point 56 of the second upper half-bridge intermediate electrode; and as shown in FIG. 1 and FIG. 3, the fifth big arm 51 is arranged parallel to and directly facing the sixth big arm 52 above the second upper half-bridge insulating substrate 5, and the fifth big arm 51 is located above the sixth big arm 61. As shown in FIG. 1, FIG. 2 and FIG. 3, a seventh big arm 61 located above the third upper half-bridge insulating substrate 6 vertically extends out from a side surface of the second main body portion 92 of the positive electrode, a seventh small arm 63 extends out from a right side of the seventh big arm 61, and the seventh small arm 63 is connected to the connection point 65 of the third positive electrode; as shown in FIG. 1, FIG. 2 and FIG. 3, an eighth big arm 62 located above the third upper half-bridge insulating substrate 6 vertically extends out from a side surface of the second main body portion 102 of the second intermediate electrode, an eighth small arm 64 extends out from a right side of the eighth big arm 62, and the eighth small arm 64 is connected to the connection point 66 of the third upper half-bridge intermediate electrode; and as shown in FIG. 2 and FIG. 3, the seventh big arm 61 is arranged in parallel to and directly facing the eighth big arm 62 above the third upper half-bridge insulating substrate 6, and the seventh big arm 61 is located above the eighth big arm 62. The first big arm 21 and the third big arm 31 are collectively called the big arm of the negative electrode, the first small arm 23 and the third small arm 33 are collectively called the small arm of the negative electrode, the second big arm 22 and the fourth big arm 32 are collectively called the big arm of the first intermediate electrode, the second small arm 24 and the fourth small arm 34 are collectively called the small arm of the first intermediate electrode, the fifth big arm 51 and the sixth big arm 61 are collectively called the big arm of the positive electrode, the fifth small arm 53 and the sixth small arm 63 are collectively called the small arm of the positive electrode, the sixth big arm 52 and the eighth big arm 62 are collectively called the big arm of the second intermediate electrode, and the sixth small arm 54 and the eighth small arm 64 are collectively called the small arm of the second intermediate electrode.

The introduction of the first big arm 21, the third big arm 31, the second big arm 22 and the fourth big arm 32 brings about the benefit that the resistance and stray inductance of the loop formed by the negative electrode and the first intermediate electrode can be balanced through adjusting widths of one or more big arms, thereby increasing the dynamic and static current-sharing performance of the power module. Moreover, since the first big arm 21 is arranged in parallel to and directly facing the second big arm 22, and the third big arm 31 is arranged in parallel to and directly facing the fourth big arm 32, the facing areas between the first big arm 21 and the second big arm 22, and between the third big arm 31 and the fourth big arm 32 are effectively increased, the current loop area between the negative electrode and the first intermediate electrode is reduced, and the stray inductance and the loss of the power module are reduced. The introduction of the fifth big arm 51, the seventh big arm 61, the sixth big arm 52 and the eighth big arm 62 brings about the benefit that the resistance and stray inductance of the loop formed by the positive electrode and the second intermediate electrode can be balanced through adjusting widths of one or more big arms, thereby increasing the dynamic and static current-sharing performance of the power module. Moreover, since the fifth big arm 51 is arranged in parallel to and directly facing the sixth big arm 52, and the seventh big arm 61 is arranged in parallel to and directly facing the eighth big arm 62, the facing areas between the fifth big arm 51 and the sixth big arm 52, and between the seventh big arm 61 and the eighth big arm 62 are effectively increased, the current loop area between the positive electrode and the second intermediate electrode is reduced, and the stray inductance and the loss of the power module are reduced.

In addition, the lower half-bridge insulating substrate is provided with a lower half-bridge unit and a lower half-bridge follow-current unit, an emitting electrode or a source electrode of the lower half-bridge unit is connected to the connection point of the negative electrode, when the lower half-bridge unit is conducted, a current flows through the lower half-bridge unit, and when the lower half-bridge unit is turned off, the current flows through the lower half-bridge follow-current unit; and the upper half-bridge insulating substrate is provided with an upper half-bridge unit and an upper half-bridge follow-current unit, a collecting electrode or a drain electrode of the upper half-bridge unit is connected to the connection point of the positive electrode, when the upper half-bridge unit is conducted, the current flows through the upper half-bridge unit, and when the upper half-bridge unit is turned off, the current flows through the upper half-bridge follow-current unit. FIG. 4 illustrates the lower half-bridge unit and the lower half-bridge follow-current unit on the first lower half-bridge insulating substrate 1, that is, a first lower half-bridge unit 17 and a first lower half-bridge follow-current unit 18; and FIG. 4 further illustrates the upper half-bridge unit and the upper half-bridge follow-current unit on the first upper half-bridge insulating substrate 4, that is, a first upper half-bridge unit 47 and a first upper half-bridge follow-current unit 48.

As shown in FIG. 4, all the lower half-bridge units share one lower half-bridge gate insulating substrate 213, which is used to connect gates of all the lower half-bridge units; all the lower half-bridge follow-current units share one lower half-bridge follow-current gate insulating substrate 321, which is used to connect gates of all the lower half-bridge follow-current units; on each lower half-bridge insulating substrate, a distance between a connection point of a lower half-bridge intermediate electrode and the lower half-bridge follow-current gate insulating substrate 321 is smaller than a distance between the connection point of the negative electrode and the lower half-bridge follow-current gate insulating substrate 321, and a distance between the connection point of the negative electrode and the lower half-bridge gate insulating substrate 213 is smaller than a distance between the connection point of the lower half-bridge intermediate electrode and the lower half-bridge gate insulating substrate 213. Therefore, a length a lower half-bridge gate lead is effectively shortened, an area of a gate loop is reduced, and the work reliability of the power module is increased.

As shown in FIG. 4, all the upper half-bridge units share one upper half-bridge gate insulating substrate 546, which is used to connect gates of all the upper half-bridge units; all the upper half-bridge follow-current units share one upper half-bridge follow-current gate insulating substrate 654, which is used to connect gates of all the upper half-bridge follow-current units; on each upper half-bridge insulating substrate, a distance between a connection point of an upper half-bridge intermediate electrode and the upper half-bridge follow-current gate insulating substrate 654 is smaller than a distance between the connection point of the positive electrode and the upper half-bridge follow-current gate insulating substrate 654, and a distance between the connection point of the positive electrode and the upper half-bridge gate insulating substrate 546 is smaller than a distance between the connection point of the upper half-bridge intermediate electrode and the upper half-bridge gate insulating substrate 546. Therefore, a length an upper half-bridge gate lead is effectively shortened, the area of the gate loop is reduced, and the work reliability of the power module is increased.

In addition, the power module may not be provided with any big arm and small arm, and may be provided with one or more combinations of big arm and small arm, such as a combination of the first big arm 21 and the first small arm 23, a combination of the second big arm 22 and the second small arm 24, a combination of the third big arm 31 and the third small arm 33, a combination of the fourth big arm 32 and the fourth small arm 34, a combination of the fifth big arm 51 and the fifth small arm 53, a combination of the sixth big arm 52 and the sixth small arm 54, a combination of the seventh big arm 61 and the seventh small arm 63, and a combination of the eighth big arm 62 and the eighth small arm 64.

Fourth Embodiment

The fourth embodiment is a power module formed by introducing an insulating septum based on the third embodiment, the part similar to the third embodiment is not repeated, and the part added on the basis of the third embodiment is described here.

Figure 5:
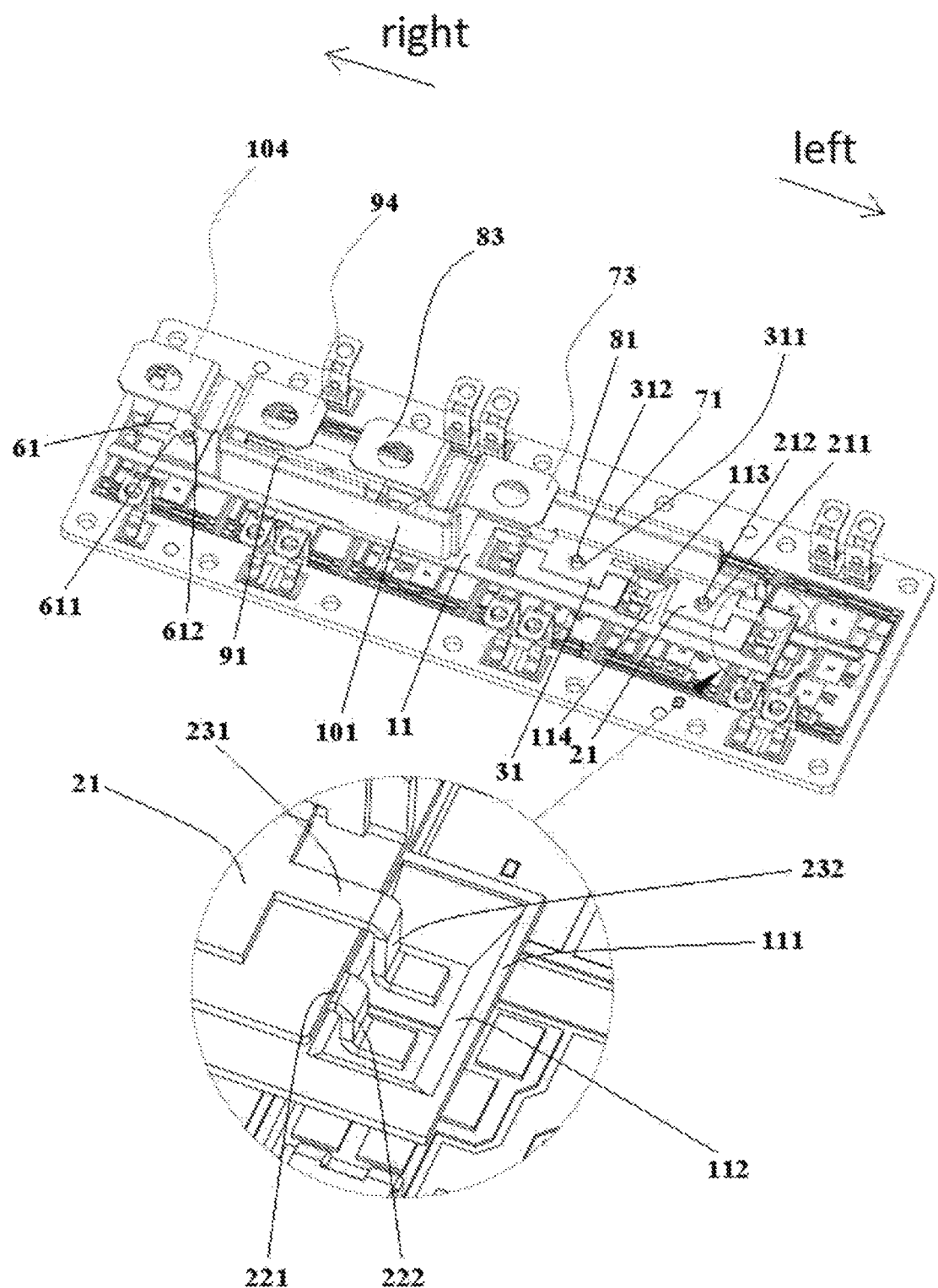
FIG. 5 is a stereoscopic diagram and a partial enlarged diagram of the power module in the fourth embodiment of the present invention.

In order to prevent dangerous conditions such as electrode arc discharge and power module burning caused by any two electrodes conducted when a chip on the insulating substrate explodes, an insulating septum 11 is arranged below the second big arm 22, the fourth big arm 32, the sixth big arm 52 and the eighth big arm 62, and as shown in FIG. 5, the insulating septum 11 is located above the insulating substrate, and extends from the first lower half-bridge insulating substrate 1 to the third upper half-bridge insulating substrate 6. The first big arm 21, the second big arm 22 and the insulating septum 11 are respectively provided with a first fixing hole 211, a second fixing hole (not shown in FIG. 5) and a first fixing hole of the insulating septum (not shown in FIG. 5), a first fixing column 212 extends upwardly from the second lower half-bridge insulating substrate 2 and passes through the first fixing hole of the insulating septum, the first fixing hole 211, and the second fixing hole in sequence, and the insulating septum 11 is fixed to the first big arm 21 and the second big arm 22, thereby increasing the mechanical stability of the power module. The third big arm 31, the fourth big arm 32 and the insulating septum 11 are respectively provided with a third fixing hole 311, a fourth fixing hole (not shown in FIG. 5) and a second fixing hole of the insulating septum (not shown in FIG. 5), a second fixing column 312 extends upwardly from the third lower half-bridge insulating substrate 3 and passes through the second fixing hole of the insulating septum, the third fixing hole 311, and the fourth fixing hole in sequence, and the insulating septum 11 is fixed to the third big arm 31 and the fourth big arm 32, thereby increasing the mechanical stability of the power module. The fifth big arm 51, the sixth big arm 52 and the insulating septum 11 are respectively provided with a fifth fixing hole (not shown in FIG. 5), a sixth fixing hole (not shown in FIG. 5) and a third fixing hole of the insulating septum (not shown in FIG. 5), a third fixing column (not shown in FIG. 5) extends upwardly from the first upper half-bridge insulating substrate 4 and passes through the third fixing hole of the insulating septum, the fifth fixing hole, and the sixth fixing hole in sequence, and the insulating septum 11 is fixed to the fifth big arm 51 and the sixth big arm 52, thereby increasing the mechanical stability of the power module. The seventh big arm 61, the eighth big arm 62 and the insulating septum 11 are respectively provided with a seventh fixing hole 611, an eighth fixing hole (not shown in FIG. 5) and a fourth fixing hole of the insulating septum (not shown in FIG. 5), a fourth fixing column 612 extends upwardly from the second upper half-bridge insulating substrate 5 and passes through the fourth fixing hole of the insulating septum, the seventh fixing hole 611, and the eighth fixing hole in sequence, and the insulating septum 11 is fixed to the seventh big arm 61 and the eighth big arm 62, thereby increasing the mechanical stability of the power module. In addition, the insulating septum 11 is further provided with a first hole 111 for the first small arm 23 and the second small arm 24 to pass through, a second hole 113 for the third small arm and the fourth small arm to pass through, a third hole (not shown in FIG. 5) for the fifth small arm 53 and the sixth small arm 54 to pass through, and a fourth hole (not shown in FIG. 5) for the seventh small arm 63 and the eighth small arm 64 to pass through. The arrangement of the insulating septum 11 can effectively separate the conductive gas generated by explosion from all electrodes, thereby increasing the use security of the power module.

In addition, the insulating septum 11 may not be provided with the fixing hole, and the first fixing column 212, the second fixing column 312, the third fixing column and the fourth fixing column 612 are all fixed on the insulating septum 11.

As shown in FIG. 5, the first small arm 23 includes a first portion 231 of the first small arm led by a coplane of the first big arm 21 and a second portion 232 of the first small arm led by the bending of the first portion 231 of the first small arm towards a direction of the insulating substrate; as shown in FIG. 5, the second small arm 24 includes a first portion 221 of the second small arm led by a coplane of the second big arm 22 and a second portion 222 of the second small arm led by the bending of the first portion 221 of the second small arm towards a direction of the insulating substrate; the third small atm 33 includes a first portion (not shown in FIG. 5) of the third small arm led by a coplane of the third big arm 31 and a second portion (not shown in FIG. 5) of the third small arm led by the bending of the first portion of the third small arm towards a direction of the insulating substrate; the fourth small arm 34 includes a first portion (not shown in FIG. 5) of the fourth small arm led by a coplane of the fourth big arm 32 and a second portion (not shown in FIG. 5) of the fourth small arm led by the bending of the first portion of the fourth small arm towards a direction of the insulating substrate; the fifth small arm 53 includes a first portion (not shown in FIG. 5) of the fifth small arm led by a coplane of the fifth big arm 51 and a second portion (not shown in FIG. 5) of the fifth small arm led by the bending of the first portion of the fifth small arm towards a direction of the insulating substrate; the sixth small arm 54 includes a first portion (not shown in FIG. 5) of the sixth small arm led by a coplane of the sixth big arm 52 and a second portion (not shown in FIG. 5) of the sixth small arm led by the bending of the first portion of the sixth small arm towards a direction of the insulating substrate; the seventh small arm 63 includes a first portion (not shown in FIG. 5) of the seven small arm led by a coplane of the seventh big arm 61 and a second portion (not shown in FIG. 5) of the seventh small arm led by the bending of the first portion of the seventh small arm towards a direction of the insulating substrate; and the eighth small arm 64 includes a first portion (not shown in FIG. 5) of the eighth small arm led by a coplane of the eighth big arm 62 and a second portion (not shown in FIG. 5) of the eighth small arm led by the bending of the first portion of the eighth small arm towards a direction of the insulating substrate.

In order to further separate the conductive gas generated by explosion of the chip on the insulating substrate from each small arm, and increase the use security of the power module, a first frame 112 surrounding the second portion 232 of the first small arm and the second portion 222 of the second small arm extends out from the first hole 111 towards a direction of the insulating substrate, as a partial enlarged diagram shown in FIG. 5; a second frame (not shown in FIG. 5) surrounding the second portion of the third small arm and the second portion of the fourth small arm extends out from the second hole 113 towards a direction of the insulating substrate; a third frame (not shown in FIG. 5) surrounding the second portion of the fifth small arm and the second portion of the sixth small arm extends out from the third hole towards a direction of the insulating substrate; and a fourth frame (not shown in FIG. 5) surrounding the second portion of the seventh small arm and the second portion of the eighth small arm extends out from the fourth hole towards a direction of the insulating substrate.

In addition, the arrangement of the insulating septum 11 may further has following conditions: firstly, the insulating septum 11 is separately arranged between some big arm and the insulating substrate; secondly, the insulating septum 11 is respectively arranged between multiple big arms and the insulating substrate; thirdly, the insulating septum 11 is respectively arranged between the negative electrode and the insulating substrate, between the first intermediate electrode and the insulating substrate, between the positive electrode and the insulating substrate, and between the second intermediate electrode and the insulating substrate; fourthly, the insulating septum 11 is arranged at a position between the negative electrode and the insulating substrate, between the first intermediate electrode and the insulating substrate, between the positive electrode and the insulating substrate, and between the second intermediate electrode and the insulating substrate; and fifthly, the insulating septum 11 is arranged at multiple positions between the negative electrode and the insulating substrate, between the first intermediate electrode and the insulating substrate, between the positive electrode and the insulating substrate, and between the second intermediate electrode and the insulating substrate.

The foregoing is the preferred embodiments of the present invention, and it shall be noted that those skilled in the art may make a plurality of improvements and decorations without departing from the principle of the present invention, and these improvements and decorations shall also be included in the protection scope of the present invention.

The invention claimed is:

1. A combined electrode, comprising a negative electrode, a first intermediate electrode, a positive electrode and a second intermediate electrode, the negative electrode comprising a main body portion of the negative electrode and a connection portion of the negative electrode, the first intermediate electrode comprising a main body portion of the first intermediate electrode and a connection portion of the first intermediate electrode in parallel to and directly facing the connection portion of the negative electrode, the positive electrode comprising a main body portion of the positive electrode and a connection portion of the positive electrode, and the second intermediate electrode comprising a main body portion of the second intermediate electrode and a connection portion of the second intermediate electrode in parallel to and directly facing the connection portion of the positive electrode, wherein the main body portion of the negative electrode angularly extends out from a side end of the connection portion of the negative electrode, and a leading portion of the negative electrode bends out of a top portion of the connection portion of the negative electrode; the main body portion of the first intermediate electrode in parallel to and directly facing the main body portion of the negative electrode angularly extends out from a side end of the connection portion of the first intermediate electrode, and a leading portion of the first intermediate electrode bends out of a top portion of the connection portion of the first intermediate electrode; the main body portion of the positive electrode angularly extends out from a side end of the connection portion of the positive electrode, and a leading portion of the positive electrode bends out of a top portion of the connection portion of the positive electrode; the main body portion of the second intermediate electrode in parallel to and directly facing the main body portion of the positive electrode angularly extends out from a side end of the connection portion of the second intermediate electrode, and a leading portion of the second intermediate electrode bends out of a top portion of the connection portion of the second intermediate electrode; and an insulating layer is arranged between the main body portion of the negative electrode and the main body portion of the first intermediate electrode, between the connection portion of the negative electrode and the connection portion of the first intermediate electrode, between the main body portion of the positive electrode and the main body portion of the second intermediate electrode, and between the connection portion of the positive electrode and the connection portion of the second intermediate electrode.

2. The combined electrode according to claim 1, wherein the leading portion of the negative electrode is arranged on contrary to the leading portion of the first intermediate electrode, and the leading portion of the positive electrode is arranged on contrary to the leading portion of the second intermediate electrode.

3. The combined electrode according to claim 2, wherein the main body portion of the positive electrode comprises a first main body portion of the positive electrode and a second main body portion of the positive electrode extending to opposite directions from two side ends of the connection portion of the positive electrode, and a bending direction of the leading portion of the positive electrode is consistent with an extending direction of the first main body portion of the positive electrode.

4. The combined electrode according to claim 2, wherein the main body portion of the second intermediate electrode comprises a first main body portion of the second intermediate electrode and a second main body portion of the second intermediate electrode extending to opposite directions from two side ends of the connection portion of the second intermediate electrode, and a bending direction of the leading portion of the second intermediate electrode is consistent with an extending direction of the first main body portion of the second intermediate electrode.

5. A three-level high-power module, wherein the combined electrode according to claim 1 is used.

6. The three-level high-power module according to claim 5, wherein further comprising an insulating substrate, wherein the insulating substrate comprises a lower half-bridge insulating substrate and an upper half-bridge insulating substrate, the lower half-bridge insulating substrate is provided with a connection point of the negative electrode and a connection point of the first intermediate electrode, the main body portion of the negative electrode is connected to the connection point of the negative electrode, the main body portion of the first intermediate electrode is connected to the connection point of the first intermediate electrode, the upper half-bridge insulating substrate is provided with a connection point of the positive electrode and a connection point of the second intermediate electrode, the main body portion of the positive electrode is connected to the connection point of the positive electrode, and the main body portion of the second intermediate electrode is connected to the connection point of the second intermediate electrode.

7. The three-level high-power module according to claim 6, wherein the main body portion of the negative electrode is connected to a big arm of the negative electrode located above the lower half-bridge insulating substrate, a small arm of the negative electrode is led out from at least one of a left side and a right side of the big arm of the negative electrode, and the small arm of the negative electrode is connected to the connection point of the negative electrode.

8. The three-level high-power module according to claim 7, wherein an insulating septum is arranged between the big arm of the negative electrode and the insulating substrate, and the insulating septum is provided with a hole for the small arm of the negative electrode to pass through.

9. The three-level high-power module according to claim 8, wherein the small arm of the negative electrode comprises a first portion of the small arm of the negative electrode led by a coplane of the big arm of the negative electrode and a second portion of the small arm of the negative electrode led by the bending of the first portion of the small arm of the negative electrode, the second portion of the small arm of the negative electrode is connected to the connection point of the negative electrode, and a frame surrounding the second portion of the small arm of the negative electrode extends out from the hole in the insulating septum towards a direction of the insulating substrate.

10. The three-level high-power module according to claim 6, wherein the main body portion of the first intermediate electrode is connected to a big arm of the first intermediate electrode located above the lower half-bridge insulating substrate, a small arm of the first intermediate electrode is led out from at least one of a left side and a right side of the big arm of the first intermediate electrode, and the small arm of the first intermediate electrode is connected to the connection point of the first intermediate electrode.

11. The three-level high-power module according to claim 10, wherein an insulating septum is arranged between the big arm of the first intermediate electrode and the insulating substrate, and the insulating septum is provided with a hole for the small arm of the first intermediate electrode to pass through.

12. The three-level high-power module according to claim 11, wherein the small atm of the first intermediate electrode comprises a first portion of the small arm of the first intermediate electrode led by a coplane of the big arm of the first intermediate electrode and a second portion of the small arm of the first intermediate electrode led by the bending of the first portion of the small arm of the first intermediate electrode, the second portion of the small arm of the first intermediate electrode is connected to the connection point of the first intermediate electrode, and a frame surrounding the second portion of the small arm of the first intermediate electrode extends out from the hole in the insulating septum towards a direction of the insulating substrate.

13. The three-level high-power module according to claim 6, wherein the main body portion of the negative electrode is connected to the big arm of the negative electrode located above the lower half-bridge insulating substrate, a small arm of the negative electrode is led out from at least one of a left side and a right side of the big arm of the negative electrode, and the small arm of the negative electrode is connected to the connection point of the negative electrode; the main body portion of the first intermediate electrode is connected to a big arm of the first intermediate electrode located above the lower half-bridge insulating substrate, a small arm of the first intermediate electrode is led out from at least one of a left side and a right side of the big arm of the first intermediate electrode, and the small arm of the first intermediate electrode is connected to the connection point of the first intermediate electrode; and the big arm of the negative electrode is arranged in parallel to and directly facing the big arm of the first intermediate electrode, and an insulating layer is arranged between the big arm of the negative electrode and the big arm of the first intermediate electrode.

14. The three-level high-power module according to claim 6, wherein the main body portion of the positive electrode is connected to a big a in of the positive electrode located above the upper half-bridge insulating substrate, a small arm of the positive electrode is led out from at least one of a left side and a right side of the big arm of the positive electrode, and the small arm of the positive electrode is connected to the connection point of the positive electrode.

15. The three-level high-power module according to claim 14, wherein an insulating septum is arranged between the big arm of the positive electrode and the insulating substrate, and the insulating septum is provided with a hole for the small arm of the positive electrode to pass through.

16. The three-level high-power module according to claim 15, wherein the small arm of the positive electrode comprises a first portion of the small arm of the positive electrode led by a coplane of the big arm of the positive electrode and a second portion of the small arm of the positive electrode led by the bending of the first portion of the small arm of the positive electrode, the second portion of the small arm of the positive electrode is connected to the connection point of the positive electrode, and a frame surrounding the second portion of the small arm of the positive electrode extends out from the hole in the insulating septum towards a direction of the insulating substrate.

17. The three-level high-power module according to claim 6, wherein the main body portion of the second intermediate electrode is connected to a big arm of the second intermediate electrode located above the upper half-bridge insulating substrate, a small arm of the second intermediate electrode is led out from at least one of a left side and a right side of the big arm of the second intermediate electrode, and the small arm of the second intermediate electrode is connected to the connection point of the second intermediate electrode.

18. The three-level high-power module according to claim 17, wherein an insulating septum is arranged between the big arm of the second intermediate electrode and the insulating substrate, and the insulating septum is provided with a hole for the small arm of the second intermediate electrode to pass through.

19. The three-level high-power module according to claim 18, wherein the small arm of the second intermediate electrode comprises a first portion of the small arm of the second intermediate electrode led by a coplane of the big arm of the second intermediate electrode and a second portion of the small arm of the second intermediate electrode led by the bending of the first portion of the small arm of the second intermediate electrode, the second portion of the small arm of the second intermediate electrode is connected to the connection point of the second intermediate electrode, and a frame surrounding the second portion of the small arm of the second intermediate electrode extends out from the hole in the insulating septum towards a direction of the insulating substrate.

20. The three-level high-power module according to claim 6, wherein the main body portion of the positive electrode is connected to the big arm of the positive electrode located above the upper half-bridge insulating substrate, a small arm of the positive electrode is led out from at least one of a left side and a right side of the big arm of the positive electrode, and the small arm of the positive electrode is connected to the connection point of the positive electrode; the main body portion of the second intermediate electrode is connected to a big arm of the second intermediate electrode located above the upper half-bridge insulating substrate, a small arm of the second intermediate electrode is led out from at least one of a left side and a right side of the big arm of the second intermediate electrode, and the small arm of the second intermediate electrode is connected to the connection point of the second intermediate electrode; and the big arm of the positive electrode is arranged in parallel to and directly facing the big arm of the second intermediate electrode, and an insulating layer is arranged between the big arm of the positive electrode and the big arm of the second intermediate electrode.

\* \* \* \* \*